(12) United States Patent  
Takata

(10) Patent No.: US 8,519,451 B2  
(45) Date of Patent: Aug. 27, 2013

(54) SEMICONDUCTOR DEVICE

(75) Inventor: Osamu Takata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/415,444

(22) Filed: Mar. 8, 2012

(65) Prior Publication Data

US 2013/0037887 A1 Feb. 14, 2013

(30) Foreign Application Priority Data

Aug. 11, 2011 (JP) .................................. 2011-176334

(51) Int. Cl.
H01L 29/66 (2006.01)
(52) U.S. Cl.
USPC ............ 257/261; 257/314; 257/315; 438/257
(58) Field of Classification Search
USPC .......................... 257/261, 314, 315; 438/257
See application file for complete search history.

(56) References Cited

U.S. PATENT DOCUMENTS

| 5,937,399 | A  | * | 8/1999 | Ohmi et al. ...................... 706/33 |
| 7,157,784 | B2 |   | 1/2007 | Mitros et al. |
| 2008/0073689 | A1 | * | 3/2008 | Wang et al. .................... 257/314 |
| 2009/0003061 | A1 | * | 1/2009 | Helm ........................ 365/185.05 |
| 2010/0213544 | A1 |   | 8/2010 | Liu et al. |
| 2011/0049620 | A1 |   | 3/2011 | Chen et al. |
| 2011/0163370 | A1 | * | 7/2011 | Endo ............................. 257/321 |
| 2012/0080739 | A1 | * | 4/2012 | Hagishima et al. ........... 257/324 |

FOREIGN PATENT DOCUMENTS

JP 2006-216947 8/2006

* cited by examiner

Primary Examiner — Ha Tran T Nguyen  
Assistant Examiner — Paul Noel  
(74) Attorney, Agent, or Firm — Patterson & Sheridan, LLP

(57) ABSTRACT

According to one embodiment, a semiconductor device includes a source region having p-type conductivity, a drain region having p-type conductivity, a channel region provided between the source region and the drain region and having n-type conductivity, a lower gate insulating film provided on the channel region, a lower gate electrode provided on the lower gate insulating film, an upper gate insulating film provided on the lower gate electrode, an upper gate electrode provided on the upper gate insulating film, and a switching element connected between the lower gate electrode and the source region.

20 Claims, 10 Drawing Sheets

US 8,519,451 B2

SEMICONDUCTOR DEVICE

CROSS-REFERENCE TO RELATED APPLICATIONS

This application is based upon and claims the benefit of priority from the prior Japanese Patent Application No. 2011-176334, filed on Aug. 11, 2011; the entire contents of which are incorporated herein by reference.

FIELD

Embodiments described herein relate generally to a semiconductor device.

BACKGROUND

Heretofore, an LDMOS (Laterally Diffused MOSFET) is used as a power MOSFET (Metal-Oxide-Semiconductor Field-Effect Transistor). Usually, a film thickness of the gate insulating film of the LDMOS is about 12.5 nm in order to reduce an ON resistance, and therefore, a gate voltage is limited to not more than 5 V. Consequently, when the power-supply voltage of this LDMOS is higher than 5 V, if the power-supply voltage is directly used as the gate voltage of the LDMOS, the gate insulating film is likely to be broken down. For this reason, when the power-supply voltage is higher than 5 V, a circuit for generating the gate voltage of the LDMOS is required, and the circuit becomes complicated. As a result, there arise problems that the semiconductor device is increased in size and increased in cost.

To enable the gate insulating film to be resistant to high voltage, it is considered to make the film thickness thereof thick. However, since current capability of the MOSFET is proportional to the capacity of the gate insulating film, and the capacity of the gate insulating film is inversely proportional to the film thickness of the gate insulating film, when the gate insulating film is made thick, the current capability is reduced inversely proportional thereto, and the ON resistance increases. Further, a threshold voltage also increases. To reduce the threshold voltage, when the impurity concentration of a channel is reduced, a short channel effect becomes remarkable. To remedy the situation, when a channel length is made long, the ON resistance further increases. To compensate for the increase of the ON resistance, when an element area is increased, the semiconductor device is further increased in size, and also increased in cost.

DETAILED DESCRIPTION

In general, according to one embodiment, a semiconductor device includes a first source region having p-type conductivity, a first drain region having p-type conductivity, a first channel region provided between the first source region and the first drain region and having n-type conductivity, a first lower gate insulating film provided on the first channel region, a first lower gate electrode provided on the first lower gate insulating film, a first upper gate insulating film provided on the first lower gate electrode, a first upper gate electrode provided on the first upper gate insulating film, a first switching element connected between the first lower gate electrode and the first source region, a second source region having n-type conductivity, a second drain region connected to the first drain region and having n-type conductivity, a second channel region provided between the second source region and the second drain region and having p-type conductivity, a second lower gate insulating film provided on the second channel region, a second lower gate electrode provided on the second lower gate insulating film, a second upper gate insulating film provided on the second lower gate electrode, a second upper gate electrode provided on the second upper gate insulating film, and a second switching element connected between the second lower gate electrode and the second source region.

Embodiments of the invention will be described below with reference to the drawings.

First, a first embodiment will be described.

Figure 1:
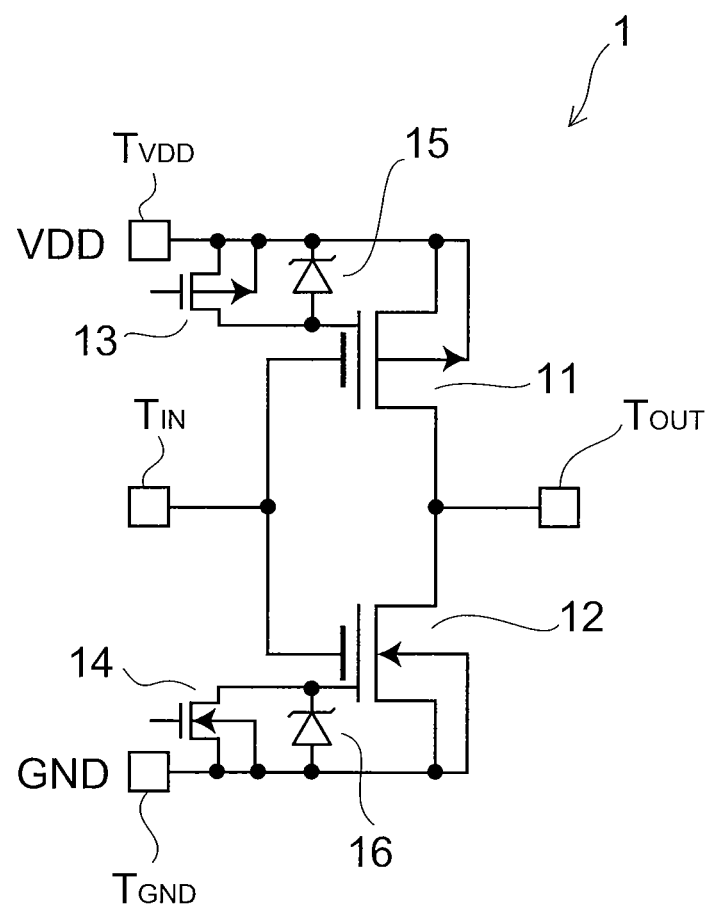
FIG. 1 shows a circuit diagram illustrating a semiconductor device according to a first embodiment.

FIG. 1 shows a circuit diagram illustrating a semiconductor device according to the embodiment.

Figure 2:
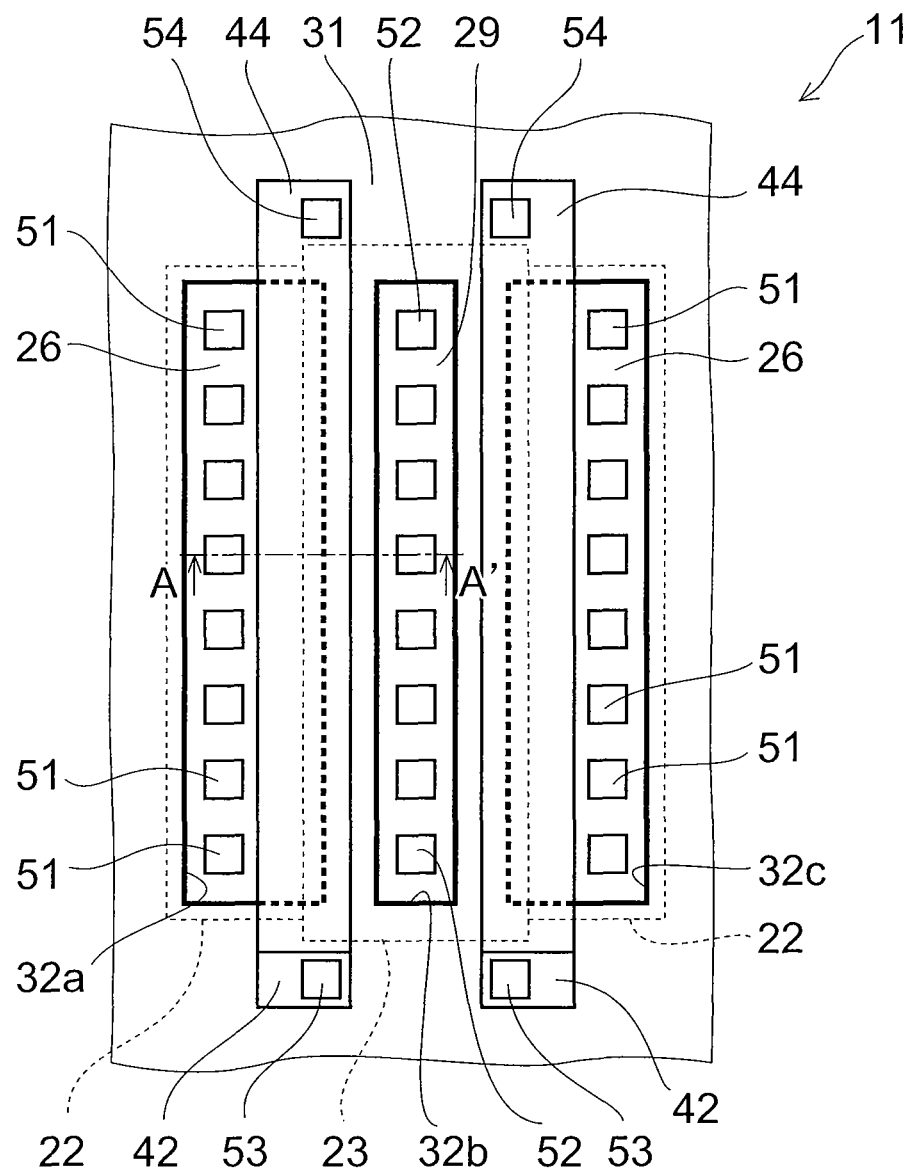
FIG. 2 shows a plan view illustrating an LDMOS of the semiconductor device according to the first embodiment.
Figure 3:
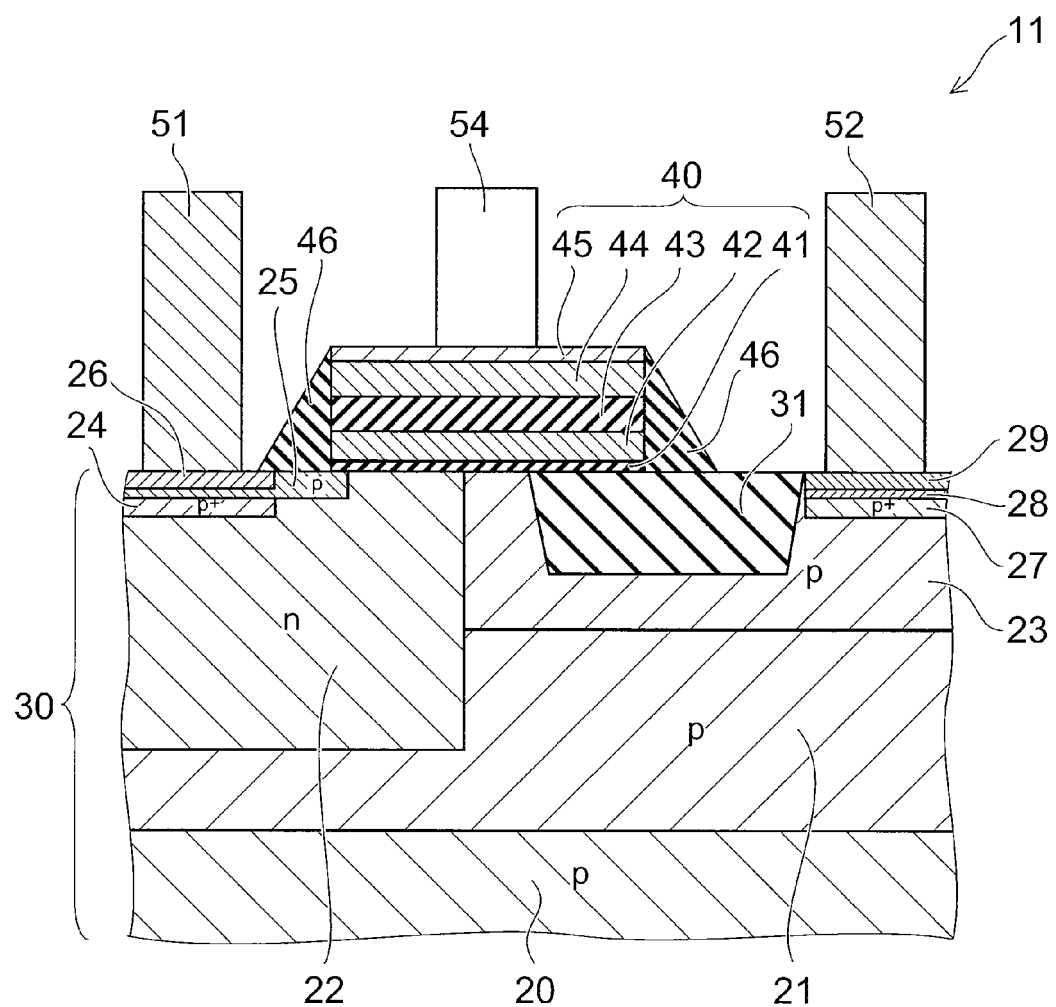
FIG. 3 is a cross-section view taken along a line A-A' shown in FIG. 2.

FIG. 2 shows a plan view illustrating an LDMOS of the semiconductor device according to the embodiment, and FIG. 3 is a cross-section view taken along a line A-A' shown in FIG. 2.

As shown in FIG. 1, a semiconductor device 1 according to the embodiment is supplied with a power supply potential VDD and a ground potential GND. The power supply potential VDD is a driving potential used for an ordinary logic circuit, and for example, it is a potential higher than 5 V, and for example, it is a fixed potential in the range of 30 to 80 V. In the semiconductor device 1, a p-channel type LDMOS 11 and an n-channel type LDMOS 12 are mutually connected to form an output circuit. As will be later described, in the p-channel type LDMOS 11 (hereinafter, simply referred to also as [pMOS 11]) and the n-channel type LDMOS 12 (hereinafter, simply referred also to as [nMOS 12]), gate electrodes are stacked in two layers.

The source of the pMOS 11 is applied with the power supply potential VDD through a power supply terminal $T_{VDD}$. The source of the nMOS 12 is applied with a ground potential GND through a ground terminal $T_{GND}$. The drain of the pMOS 11 and the drain of the nMOS 12 are connected in common to an output terminal $T_{OUT}$. An upper gate electrode 44 (refer to FIG. 3) of the pMOS 11 and an upper gate electrode 44 of the nMOS 12 receive input signals through an input terminal $T_{IN}$. The input signal is a binary signal having the power supply potential VDD or the ground potential GND.

A switching element 13 is connected between a lower gate electrode 42 (refer to FIG. 3) of the pMOS 11 and a source of the pMOS11. The switching element 13 is an element for switching whether or not the lower gate electrode 42 of the pMOS 11 is connected to the source, and for example, the element is a p-channel type MOSFET. Further, a switching element 14 is connected between the lower gate electrode 42 of the nMOS 12 and a source of the nMOS 12. The switching element 14 is an element for switching whether or not the lower gate electrode 42 of the pMOS 12 is connected to the source, and for example, the element is an n-channel type MOSFET. The switching elements 13 and 14, for example, are transistors having a low voltage and a small current with the gate voltage thereof being about 5V. The areas of the switching elements 13 and 14 are smaller than the areas of the pMOS 11 and the nMOS 12.

Further, a Zener diode 15 is connected between the lower gate electrode 42 of the pMOS 11 and the source of the pMOS 11. An anode of the Zener diode 15 is connected to the lower gate electrode 42 of the pMOS 11, and a cathode thereof is connected to the source of the pMOS 11. Furthermore, a Zener diode 16 is connected between the lower gate electrode 42 of the nMOS 12 and the source of the nMOS 12. An anode of the Zener diode 16 is connected to the source of the nMOS 12, and a cathode thereof is connected to the lower gate electrode 42 of the pMOS 11.

Next, the configurations of the pMOS 11 and the nMOS 12 will be described.

As shown in FIGS. 2 and 3, the pMOS 11 is formed on the surface of a silicon substrate 20. The conductivity type of the silicon substrate 20, for example, is a p-type. A part of the region on the silicon substrate 20 is provided with a drain side well 21 whose conductivity type is a p-type, and two areas of the region on the drain side well 21 are provided with source side wells 22 whose conductivity type is an n-type. The region sandwiched by the source side wells 22 on the drain side well 21 is provided with a drift region 23 whose conductivity type is a p-type. The source side wells 22 and the drift region 23 are in contact with each other. Further, the lower faces of the source side wells 22 are positioned below the lower face of the drift region 23.

A region isolated from the drift region 23 on each of the source side wells 22 is provided with a source region 24 whose conductivity type is a $p^+$-type. On an area directly above the source region 24 and on an area on the side of the drift region 23 viewed from this directly above area, there is provided an LDD (Lightly Doped Drain) region 25 whose conductivity type is a p-type. However, the LDD region 25 is isolated from the drift region 23. A silicide layer 26 is provided on the directly above area of the source region 24 on the LDD region 25.

A region isolated from the source side well 22 on the drift region 23 is provided with a drain region 27 whose conductivity type is $p^+$-type. The area directly above the drain region 27 is provided with an LDD region 28 whose conductivity type is a p-type. The LDD region 28 is not provided in the region on the side of the source side well 22 when viewed from the directly above area of the drain region 27. A silicide layer 29 is provided on the LDD region 28.

A silicon base material 30 includes the silicon substrate 20, the drain side well 21, the source side wells 22, the drift region 23, the source region 24, the LDD region 25, the silicide layer 26, the drain region 27, the LDD region 28, and the silicide layer 29. On a part of the silicon base material 30, for example, an STI (Shallow Trench Isolation: Element Isolation Insulator) 31 composed of silicon oxide is provided. The upper face of the silicon base material 30 and the upper face of the STI 31 constitute approximately the same plane.

The region in which the STI 31 is not provided becomes rectangular openings 32a, 32b, and 32c when viewed from above. The openings 32a, 32b, and 32c are arranged in this order along the shorter direction of each opening. In the openings 32a and 32c, a part of the source side wells 22, the LDD region 25, the silicide layer 26, and a part of the drift region 23 are exposed. In the opening 32b, the silicide layer 29 is exposed. Consequently, a portion located between the opening 32a and the opening 32b in the STI 31 and a portion located between the opening 32b and the opening 32c are arranged between the source region 24 and the drain region 27.

In each of the region ranging from a part of the area directly above the STI 31 to a part of the area directly above the opening 32a, and the region ranging from a part of the area directly above the STI 31 to a part of the area directly above the opening 32c, a gate stacked body 40 is provided. The shape of each gate stacked body 40 is rectangular with the longitudinal direction of the openings 32a and 32c as a longitudinal direction, and covers a part of the STI 31, a part of the drift region 23, a part of the source side wells 22, and a part of the LDD region 25.

In the gate stacked body 40, there are stacked a lower gate insulating film 41, a lower gate electrode 42, an upper gate insulating film 43, an upper gate electrode 44, and a silicide layer 45 sequentially in order from the lower layer side. The lower gate insulating film 41, for example, is composed of a silicon oxide, and its film thickness, for example, is suitable for the gate voltage of about 1.5 to 5.5 V, and for example, its thickness is 12.5 nm. The upper gate insulating film 43, for example, is a two-layered film (ON film) stacked with a single-layer silicon oxide film or a silicon oxide layer and a silicon nitride layer, or a three-layered film (ONO film) stacked with the silicon oxide layer, the silicon nitride layer, and the silicon oxide layer, and a film thickness by means of an electric measuring method is larger than the lower gate insulating film 41. The inclusion of a silicon nitride having a higher dielectric constant than a silicon oxide into the upper gate insulating film 43 can increase the dielectric constant of the entire upper gate insulating film 43.

The lower gate electrode 42 and the upper gate electrode 44, for example, are formed of polysilicon added with impurities. On the side face of the gate stacked body 40, for example, a side wall 46 composed of silicon oxide is provided. The source side LDD region 25 is arranged in the area almost directly below the side wall 46. On the other hand, the drain side LDD region 28 is not arranged in the area directly below the side wall 46. In FIG. 2, illustrations of the silicide layer 45 and the side wall 46 are omitted.

In the area directly above the silicide layer 26, there are provided a plurality of source contacts 51, which are connected to the silicide layer 26. In the area directly above the silicide layer 29, there are provided a plurality of drain contacts 52, which are connected to the silicide layer 29. The lower gate electrode 42 extends from the area directly below the upper gate electrode 44 in the longitudinal direction. In the area directly above the extended portion of the lower gate electrode 42, there is provided a lower gate contact 53, which is connected to the lower gate electrode 42. In the area directly above the silicide layer 45, there is provided one upper gate contact 54, which is connected to the silicide layer 45.

On the other hand, the nMOS 12 is also formed on the silicon substrate 20. That is, the pMOS 11 and the nMOS 12 are formed on the same silicon substrate 20. The configuration of the nMOS 12 is such that the conductivity types of the constituent elements other than the silicon substrate 20 are reversed with respect to the configuration of the p-MOS 11 shown in FIGS. 2 and 3. That is, in the nMOS 12, there are provided an n-type drain side well 21, p-type source side wells, an n-type drift region 23, an n$^+$-type source region 24, an n-type LDD region 25, a silicide layer 26, an n$^+$-type drain region 27, an n-type LDD region 28, and the silicide layer 29. The STI 31 is selectively provided on the silicon base material 30, and in a part of the areas directly above the silicon base material 30 and the STI 31, the gate stacked body 40 is provided.

Similarly to the pMOS 11, in the gate stacked 40, there are stacked the lower gate insulating film 41, the lower gate electrode 42, the upper gate insulating film 43, the upper gate electrode 44, and the silicide layer 45 sequentially in order from the lower layer side. The side wall 46 is provided on the side face of the gate stacked body 40. Between the pMOS 11 and the nMOS 12, the film thicknesses and compositions of the lower gate insulating films 41 are mutually equal, the thicknesses and compositions of the lower gate electrodes 42 are mutually equal, the film thicknesses and compositions of the upper gate insulating films 43 are mutually equal, the thicknesses and compositions of the upper gate electrodes 44 are mutually equal, and the thicknesses and compositions of the silicide layers 45 are mutually equal.

Next, the operation of the semiconductor device 1 thus constituted will be described.

Figure 4:
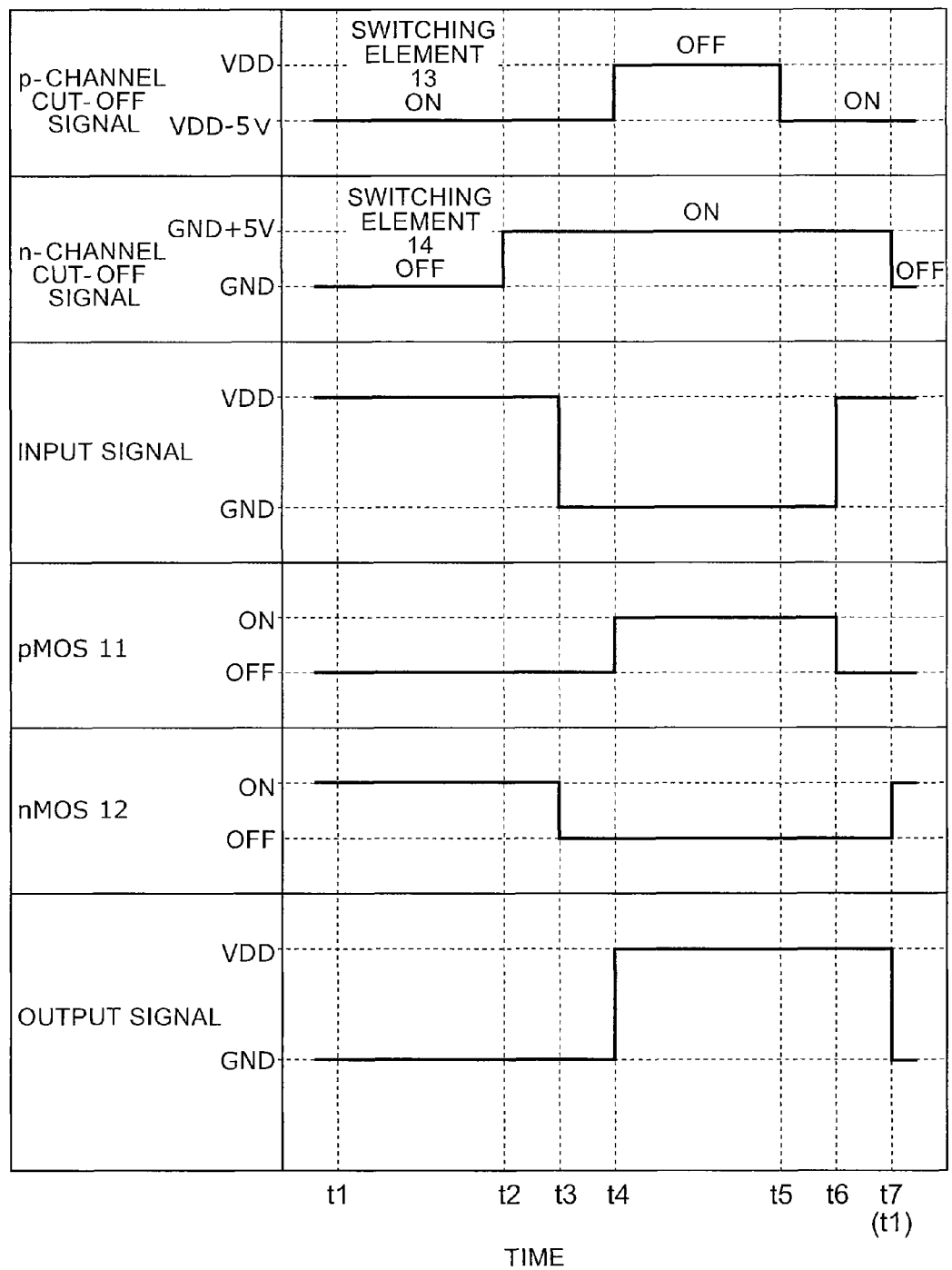
FIG. 4 is a timing chart illustrating the operation of the semiconductor device according to the first embodiment with the time represented in a horizontal axis and the potential of each signal represented in a vertical axis.

FIG. 4 is a timing chart illustrating the operation of the semiconductor device according to the embodiment with the time represented in a horizontal axis and the potential of each signal represented in a vertical axis.

The source of the pMOS 11 always receives the power supply potential VDD, and the source of the pMOS 12 always receives the ground potential GND. Further, the power supply potential VDD and the ground potential GND are switched and input to the input terminal $T_{IN}$ as input signals.

In addition, the power supply potential VDD and a potential (VDD−5 V) lower than this power supply potential VDD by 5 V are switched and input to the gate of the switching element 13 composed of a p-channel type MOSFET as a p-channel cut-off signal, and the ground potential GND and a potential (GND+5 V) higher than this ground potential GND by 5 V are switched and input to the gate of the switching element 14 composed of an n-channel type MOSEFT as an n-channel cut-off signal.

Hereinafter, a change of the potential of each signal, and a change of the state of each element associated therewith will be described with reference to FIG. 4.

(A) Time t1

In the time t1, the gate of the switching element 13 receives the potential (VDD−5 V) as the p-channel cut-off signal. Thus, the switching element 13 is in an ON state. Further, the gate of the switching element 14 receives the ground potential GND as the n-channel cut-off signal. Hence, the switching element 14 is in an OFF state. In addition, the input terminal $T_{IN}$ receives the power supply potential VDD as an input signal. At this time, since the switching element 13 is in the ON state, the potential of the lower gate electrode 42 of the pMOS 11 is the power supply potential VDD, and the pMOS 11 is in the OFF state. On the other hand, since the switching element 14 is in the OFF state, the lower gate electrode 42 of the nMOS 12 is in a floating state, and has a potential between the ground potential GND and the power supply potential VDD. Thus, the nMOS 12 is in the ON state. As a result, the ground potential GND is output from an output terminal $T_{OUT}$. At this time, though a high voltage (VDD-GND) is applied between the upper gate electrode 44 and the channel of the nMOS 12, since the potential of the lower gate electrode 42 becomes a potential between the ground potential GND and the power supply potential VDD, an electric field applied to the upper gate insulating film 43 and the lower gate insulating film 41 is relaxed.

(B) Time t2

In the time t2, the n-channel cut-off signal input to the gate of the switching element 14 is boosted to the potential (GND+5 V) from the ground potential GND. Thereby, the switching element 14 becomes the ON state.

(C) Time t3

In the time t3, the input potential input to the input terminal $T_{IN}$ is switched to the ground potential GND from the power supply potential VDD. At this time, since the switching element 14 is in the ON state, an electric charge is rapidly discharged from the lower gate electrode 42 of the nMOS 12, and the potential thereof becomes the ground potential GND. As a result, the nMOS 12 becomes the OFF state. On the other hand, at this point of time, since the switching element 13 is still in the ON state, and the potential of the lower gate electrode 42 of the pMOS 11 is the power supply potential VDD, the pMOS 11 remains in the OFF state.

(D) Time t4

In the time t4, the p-channel cut-off signal input to the gate of the switching element 13 is boosted to the power supply potential VDD from the potential (VDD−5 V). Thereby, the switching element 13 becomes the OFF state. As a result, the lower gate electrode 42 of the pMOS 11 is in a floating state, and the potential thereof becomes a potential between the ground potential GND and the power supply potential VDD, and thus, the pMOS 11 is in the ON state. As a result, the power supply potential VDD is output from the output terminal $T_{OUT}$. At this time, though a high voltage (VDD-GND) is applied between the upper gate electrode 44 and the channel of the pMOS 11, since the potential of the lower gate electrode 42 becomes a potential between the ground potential GND and the power supply potential VDD, an electric field applied to the upper gate insulating film 43 and the lower gate insulating film 41 is relaxed.

(E) Time t5

In the time t5, the voltage of the p-channel cut-off signal input to the gate of the switching element 13 is lowered to the potential (VDD−5 V) from the power supply potential VDD. Thereby, the switching element 13 becomes the ON state.

(F) Time t6

In this time t6, the input potential input to the input terminal $T_{IN}$ is switched to the power supply potential VDD from the ground potential GND. At this time, since the switching element 13 is in the ON state, the electrical charge is rapidly injected into the lower gate electrode 42 of the pMOS 11, and the potential thereof becomes the power supply potential VDD. As a result, the pMOS 11 becomes the OFF state. On the other hand, at this point of time, since the switching element 14 is still in the ON state, and since the potential of the lower gate electrode 42 of the nMOS 12 is the ground potential GND, the nMOS 12 remains in the OFF state.

(G) Time t7

In the time t7, the voltage of the n-channel cut-off signal input to the gate of the switching element 14 is lowered to the ground potential GND from the potential (GND+5 V). Thereby, the switching element 14 becomes the OFF state. As a result, the lower gate electrode 42 of the nMOS 12 is in a floating state, and the potential thereof becomes a potential between the ground potential GND and the power supply potential VDD, and thus, the nMOS 12 becomes the ON state. As a result, the ground potential GND is output from the output terminal $T_{OUT}$. Thereby, a state of the time t1 is restored. From then onward, the operations in the times t1 to t7 are repeated.

Next, the effect of the embodiment will be described.

In the embodiment, in each of the pMOS 11 and the nMOS 12, there are stacked the lower gate insulating film 41, the lower gate electrode 42, the upper gate insulating film 43, and the upper gate electrode 44 in this order, thereby forming the gate stacked body 40 having a two-layered gate electrode. This allows the gate voltage applied between the source and gate of each transistor to be divided by the lower gate insulating film 41 and the upper gate insulating film 43, and thus, the high gate voltage can be applied. For this reason, as the gate potential, the power supply potential VDD and the ground potential GND can be used as they are. As a result, the circuit for generating the gate potential becomes unnecessary, and the size and the cost of the semiconductor device can be reduced. Further, since an electric-field stress applied to the lower gate insulating film 41 and the upper gate insulating film 43 can be relaxed, the same life as the life of the ordinary LDMOS can be realized.

In the embodiment, since the gate insulating film is divided into two layers of the lower gate insulating film 41 and the upper gate insulating film 43, the film thickness of the lower gate insulating film 41 can be made thin for the gate voltages applied to the pMOS 11 and the ncMOS 12. Hence, the capacity of the lower gate insulating film 41 can be made large. As described above, since the current capability of the MOSFET is proportional to the capacity of the gate insulating film, the current capabilities of the pMOS 11 and the nMOS 12 can be made larger with the ON resistance kept low. Further, as compared with the case where one thick gate insulating firm is formed, the adverse effect such as an increase of threshold voltage is reduced, and a deposition process is also easy.

Further, in the embodiment, the switching element 13 is provided between the lower gate electrode 42 and the source of the pMOS 11. Thereby, switching can be made whether or not the lower gate electrode 42 of the pMOS 11 is connected to a power supply terminal $T_{VDD}$. Similarly, the switching element 14 is provided between the lower gate electrode 42 and the source of the nMOS 12. Thereby, switching can be made whether or not the lower gate electrode 42 of the nMOS 12 is connected to the ground terminal $V_{GND}$. Thereby, the electric charge can be rapidly charged and discharged for each of the lower gate electrodes 42, and the operation of the semiconductor device 1 can be made fast.

As shown in FIG. 4, with the timing for switching an input potential made different from the timing for turning on and off the switching elements 13 and 14, both of the pMOS 11 and the nMOS 12 can be put into an OFF state during the time zone from the time t3 to the time t4 of FIG. 4 and the time zone from the time t6 to the time t7. Thereby, when the input potential is switched, both of the pMOS 11 and nMOS 12 are put into an ON state at the same time, and a through current can be surely prevented from flowing between the power supply terminal $T_{VDD}$ and the ground terminal $V_{GND}$.

In the embodiment, between the lower gate electrode 42 and the source of the nMOS 11, a Zener diode 15 is provided so that its forward direction becomes the direction to the source from the lower gate electrode 42. Thereby, the potential of the lower gate electrode 42 is prevented from becoming higher than the power supply potential VDD. When the potential of the lower gate electrode 42 becomes lower than the power supply potential VDD by a fixed voltage or higher, a reverse current is made to flow through the Zener diode 15. Thus, the lower gate insulating film 41 of the nMOS 11 can be protected. Similarly, between the lower gate electrode 42 and the source of the pMOS 12, a Zener diode 16 is provided so that its forward direction becomes the direction to the lower gate electrode 42 from the source. Thereby, the potential of the lower gate electrode 42 is prevented from becoming lower than the ground potential GND. When the potential of the lower gate electrode 42 becomes higher than the ground potential GND by a fixed voltage or higher, the reverse current is made to flow through the Zener diode 16. Thus, the lower gate insulating film 41 of the pMOS 11 can be protected.

Next, a comparative example will be described.

Figure 5:
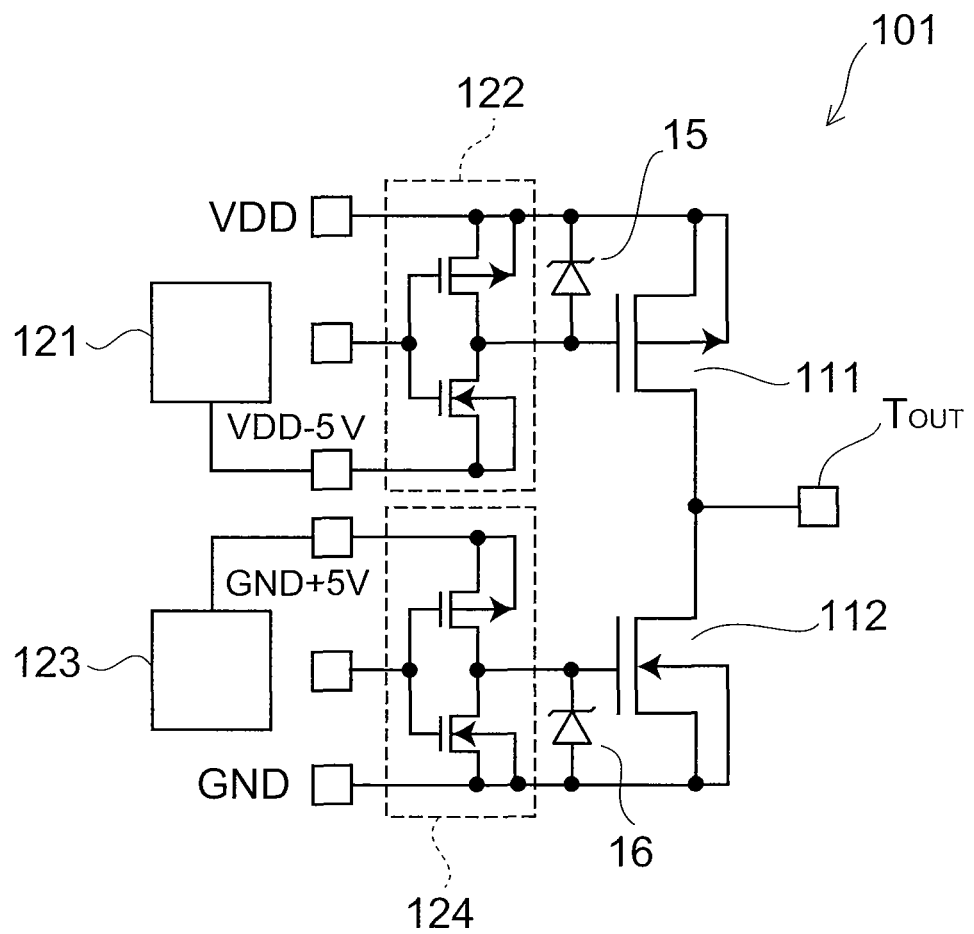
FIG. 5 shows a circuit diagram illustrating a semiconductor device according to a comparative example.

FIG. 5 shows a circuit diagram illustrating a semiconductor device according to the comparative example.

Figure 6:
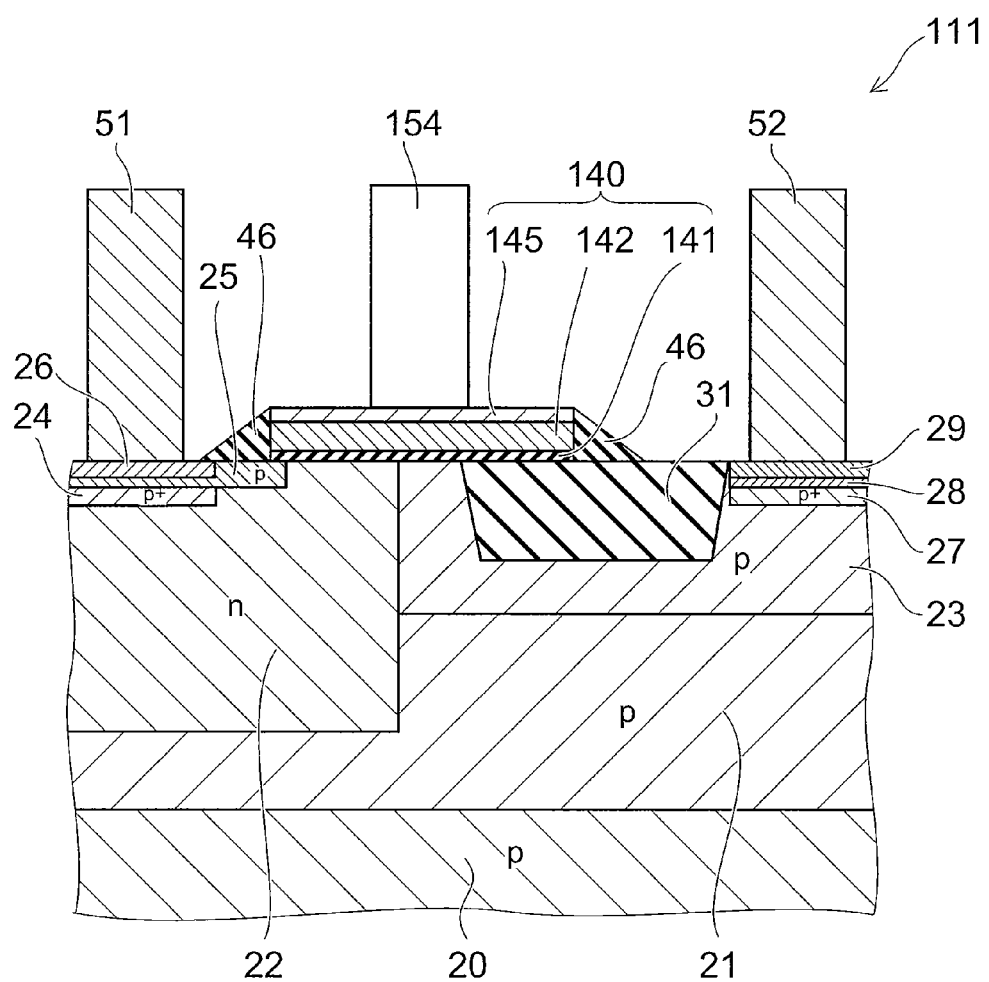
FIG. 6 is a cross-section view illustrating an LDMOS of the semiconductor device according to the comparative example.

FIG. 6 is a cross-section view illustrating an LDMOS of the semiconductor device according to the comparative example.

As shown in FIGS. 5 and 6, a semiconductor device 101 according to the comparative example is different as compared with the first embodiment in that only one layer each of the gate insulating film and the gate electrode is provided in each of a p-channel type LDMOS 111 and an n-channel type LDMOS 112. That is, in a gate stacked body 140, there are stacked a gate insulating film 141, a gate electrode 142, and a silicide layer 145 sequentially in order from the lower layer side. The silicide layer 145 is connected with a gate contact 154. The film thickness of the gate insulating film 141 is a thickness corresponding to the gate voltage of about 5 V.

For this reason, in the semiconductor device 101, it is not possible to apply the ground potential GND to the gate of the p-channel type LDMOS 111, and a potential generation circuit 121 for generating a potential (VDD−5 V) is required as a gate potential of the low potential side. Further, an inverter circuit 122 is also required for switching the power supply potential VDD and the potential (VDD−5 V) so as to supply the potential to the gate of the p-channel type LDMOS 111. Similarly, it is not possible to apply the power supply potential VDD to the gate of the n-channel type LDMOS 112, and a potential generation circuit 123 for generating a potential (GND+5 V) as a gate potential of the high potential side is required. Further, an inverter circuit 124 is also required for switching the ground potential GND and the potential (GND+5 V) so as to supply the potential to the gate of the n-channel type LDMOS 112. As a result, the semiconductor device 101 is complicated in circuit configuration, and is difficult in achieving small size and low cost.

Next, a second embodiment will be described.

Figure 7:
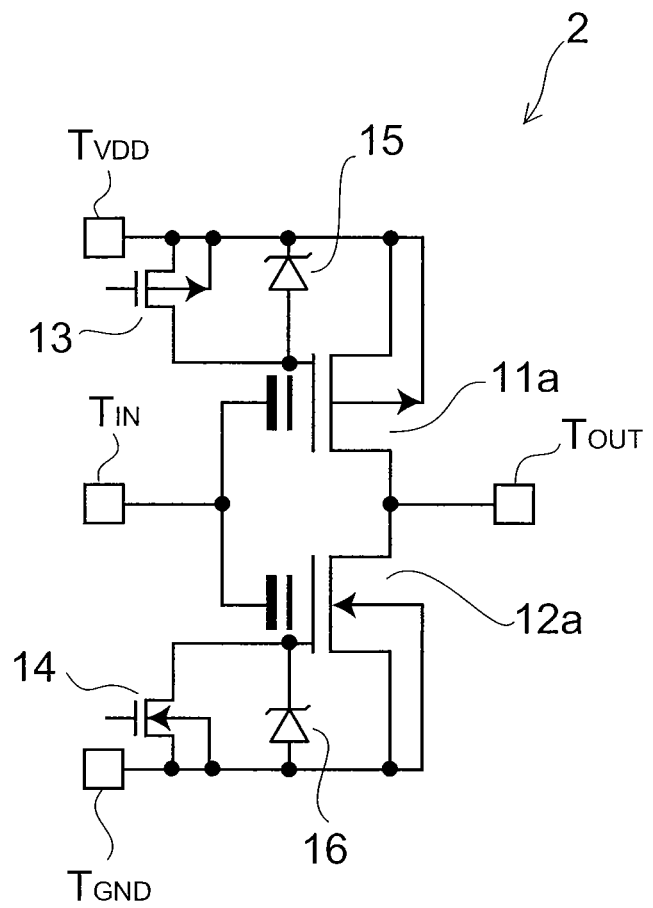
FIG. 7 is a circuit diagram illustrating a semiconductor device according to a second embodiment.

FIG. 7 is a circuit diagram illustrating a semiconductor device according to the embodiment.

Figure 8:
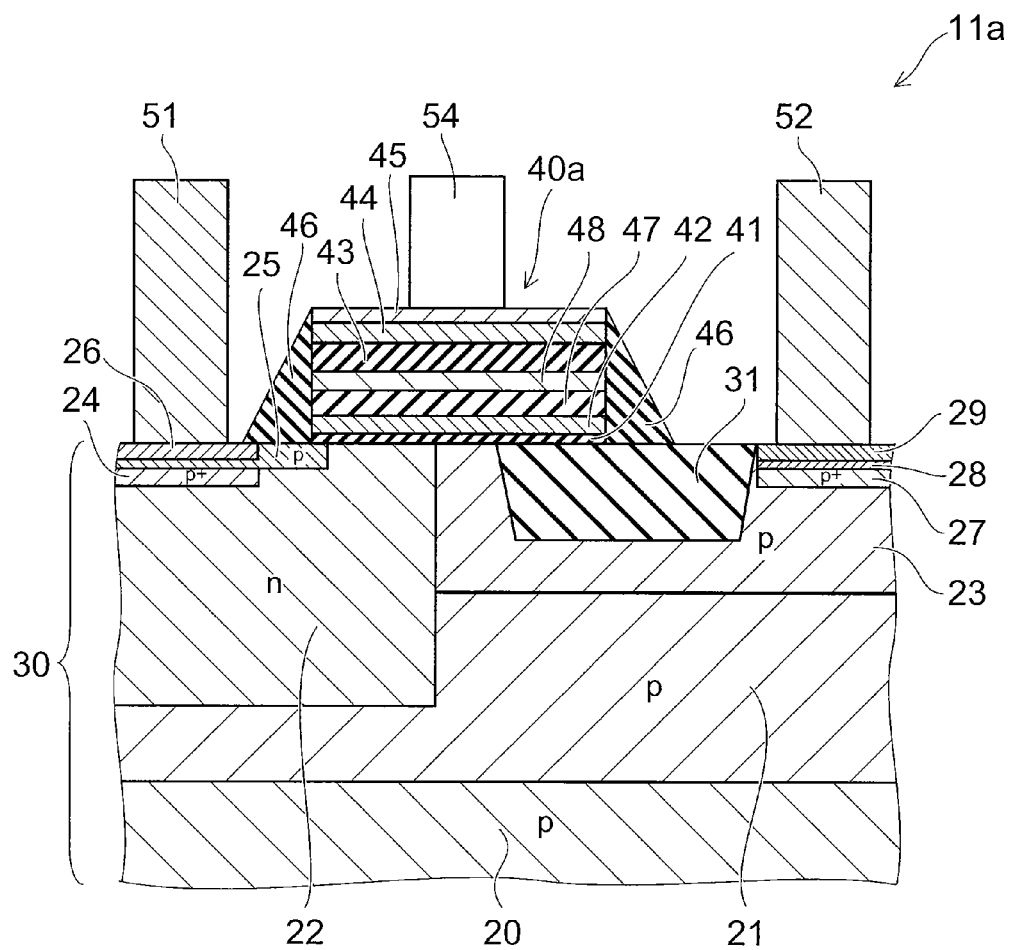
FIG. 8 is a cross-section view illustrating an LDMOS of the semiconductor device according to the embodiment.

FIG. 8 is a cross-section view illustrating an LDMOS of the semiconductor device according to the embodiment.

As shown in FIGS. 7 and 8, a semiconductor device 2 according to the embodiment is different as compared with the first embodiment in that three layers each of the gate insulating film and the gate electrode are provided in each of a p-channel type LDMOS 11a and an n-channel type LDMOS 12a. That is, in a gate stacked body 40, there are stacked a lower gate insulating film 41, a lower gate electrode 42, a middle gate insulating film 47, a middle gate electrode 48, an upper gate insulating film 43, an upper gate electrode 44, and a silicide layer 45 sequentially in order form the lower layer side. The electrical film thickness of the middle gate insulating film 47 is larger than the thickness of the lower gate insulating film 41, and smaller than the thickness of the upper gate insulating film 43. The middle gate electrode 48 may be put into a floating state, and similarly to the lower gate electrode 42, at least one of the switching element and the Zener diode may be connected between the source and the middle gate electrode 48.

According to the embodiment, as compared with the first embodiment, the gate voltage can be divided by three gate insulating films, and therefore, much higher gate voltage can be applied. For example, the gate voltage of about 30 to 100 V can be applied. The configuration, the operation, and the effect other than those described above in the embodiment are the same as those of the first embodiment. The gate insulating film and the gate electrode may be stacked with not less than four layers.

Next, a third embodiment will be described.

Figure 9:
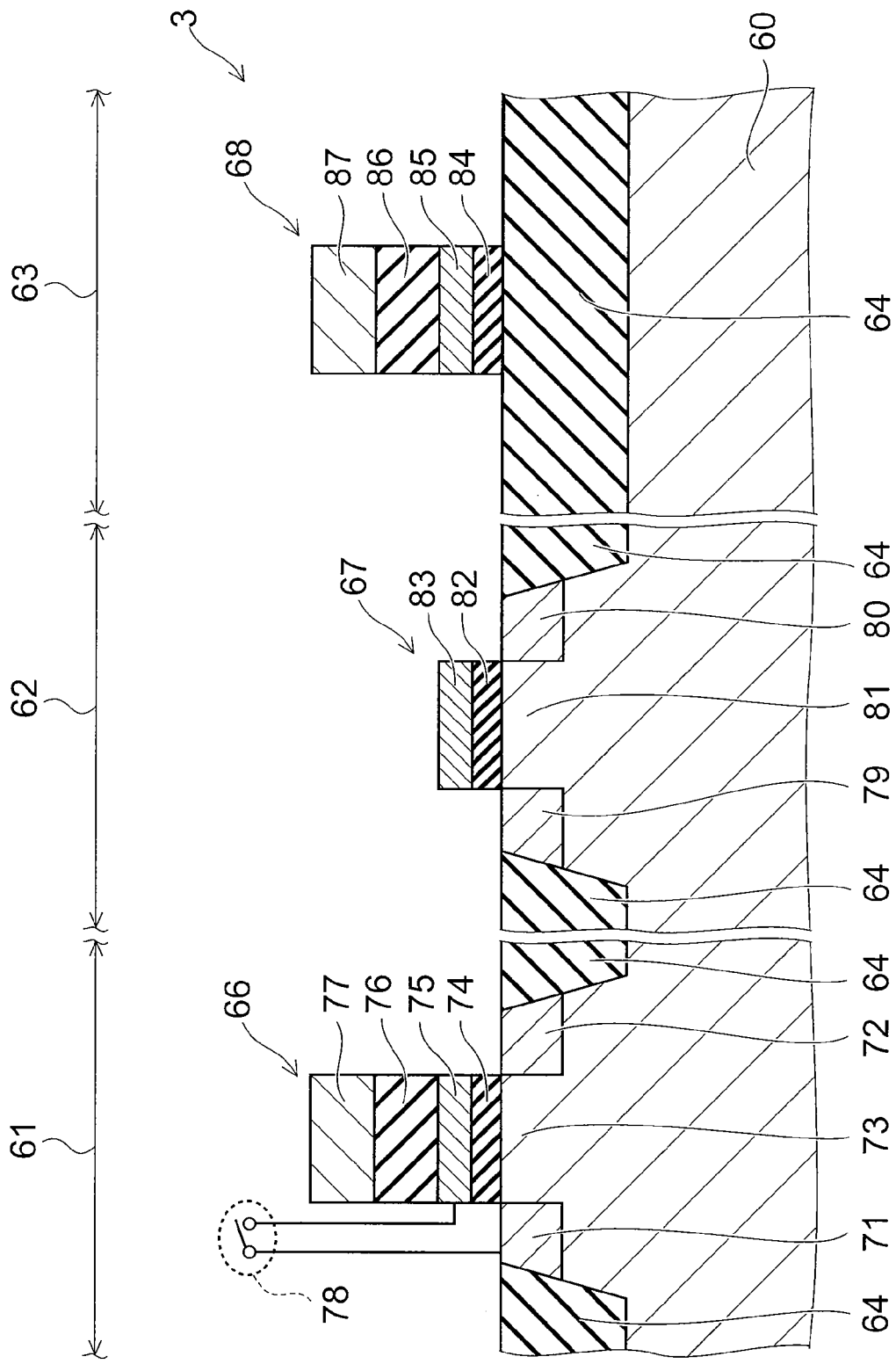
FIG. 9 is a cross-section view illustrating a semiconductor device according to a third embodiment.

FIG. 9 is a cross-section view illustrating a semiconductor device according to the embodiment.

As shown in FIG. 9, in a semiconductor device 3 according to the embodiment, a silicon substrate 60 is provided with an output circuit region 61, a logic circuit region 62, and a capacitor region 63. The output circuit region 61 and the logic circuit region 62, for example, are partitioned by an STI 64.

In the output circuit region 61, a power circuit MOSFET 66 is formed. That is, a source region 71 and a drain region 72 are formed separately from each other on an upper layer portion of the silicon substrate 60, and a channel region 73 is formed between the source region 71 and the drain region 72. In the area directly above the channel region 73 on the silicon substrate 60, there are stacked a lower gate insulating film 74, a lower gate electrode 75, an upper gate insulating film 76, and an upper gate electrode 77 sequentially in order from the lower layer side. A switching element 78 is connected between the source region 71 and the lower gate electrode 75. The gate voltage applied to the power circuit MOSFET 66, for example, is about 30 to 80 V.

In the logic circuit region 62, a logic circuit MOSFET 67 is formed. That is, a source region 79 and a drain region 80 are formed separately from each other on an upper layer portion of the silicon substrate 60, and a channel region 81 is formed between the source region 79 and the drain region 80. In the area directly above the channel region 81 on the silicon substrate 60, there are stacked a gate insulating film 82 and a gate electrode 83 sequentially in order from the lower layer side. The gate voltage applied to the logic circuit MOSFET 67, for example, is 5 V, and lower than the gate voltage applied to the power circuit MOSFET 66.

The capacitor region 63 is provided with a PIP (Poly-Insulator-Poly) capacitor 68. That is, the STI 64 is provided on the silicon substrate 60, and an insulating film 84, a lower electrode 85, a capacitive insulating film 86, and an upper electrode 87 are stacked on the STI 64 sequentially in order from the lower layer side.

The lower gate insulating film 74 of the power circuit MOSFET 66, the gate insulating film 82 of the logic circuit MOSFET 67, and the insulating film 84 of the PIP capacitor 68 are formed with the same process. Consequently, the film thicknesses and compositions of these insulating films are mutually equal.

The lower gate electrode 75 of the power circuit MOSFET 66, the gate electrode 83 of the logic circuit MOSFET 67, and the lower electrode 85 of the PIP capacitor 68 are formed with the same process. Consequently, the thicknesses and the compositions of these electrodes are mutually equal.

Further, the upper gate insulating film 76 of the power circuit MOSFET 66 and the capacitive insulating film 86 of the PIP capacitor 68 are formed with the same process. Consequently, the film thicknesses and the compositions of these insulating films are mutually equal.

Furthermore, the upper gate electrode 77 of the power circuit MOSEFT 66 and the upper electrode 87 of the PIP capacitor 68 are formed with the same process. Consequently, the thicknesses and the compositions of these electrodes are mutually equal.

According to the embodiment, the power MOSFET 66 can be simultaneously formed with the logic circuit MOSFET 67 and the PIP capacitor 68. Thereby, the manufacturing cost of the semiconductor device 3 can be suppressed. The effect other than those described above in the embodiment is the same as that of the first embodiment. In the embodiment also, similarly to the first embodiment, the power MOSFET 66 is allowed to become the LDMOS. Further, similarly to the first embodiment, the combination of the p-channel type MOSEFT and the n-channel type MOSFET may constitute an output circuit.

Next, a reference example will be described.

Figure 10:
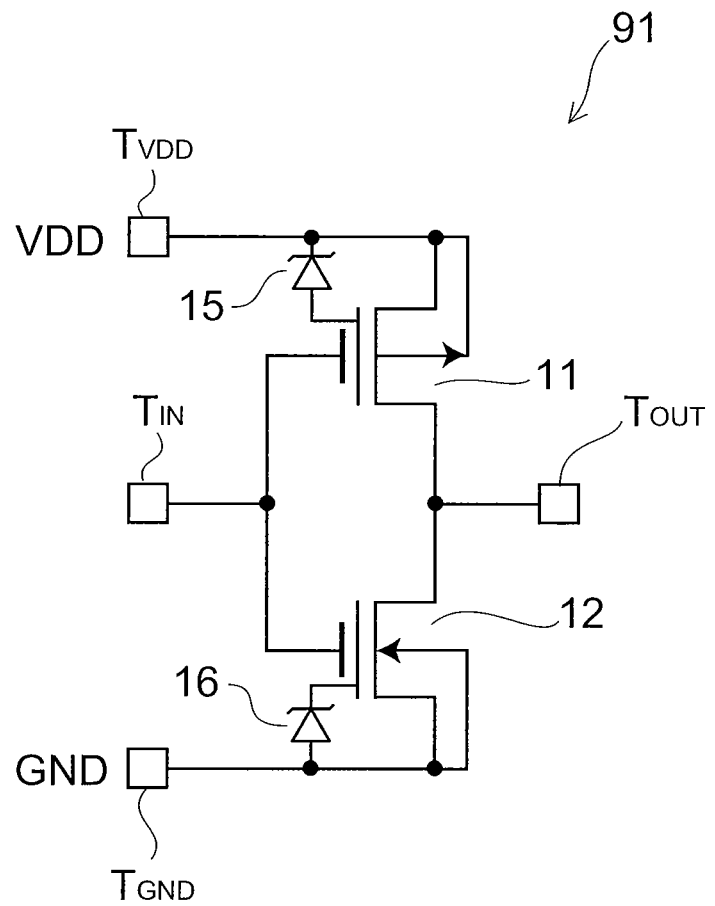
FIG. 10 is a circuit diagram illustrating a semiconductor device according to a reference example.

FIG. 10 is a circuit diagram illustrating a semiconductor device according to the reference example.

As shown in FIG. 10, a semiconductor device 91 according to the reference example is different as compared with the semiconductor device 1 (refer to FIG. 1) according to the first embodiment in that the switching elements 13 and 14 are not provided.

In the semiconductor device 91 according to the reference example, though the operations shown in FIG. 4 cannot be realized, the forming of the gate insulating film in a two-layered configuration can obtain the effect of dividing the gate voltage. Thus, as an input potential, a power supply potential VDD and a ground potential GND can be used as they are, and a circuit configuration can be simplified. Further, the provision of Zener diodes 15 and 16 can protect the lower gate insulating film of each LDMOS.

In each of the embodiments as described above, though an example of allowing the structure of the transistor having a two-layered gate electrode to become the LDMOS structure or the ordinary MOS structure is shown, the structure is not limited to those structures. The transistor having the gate electrode in a two-layered structure may be a field-effect transistor, and for example, may be a DMOS (Double-Diffused MOSFET).

In the first and the second embodiments, though an example of mutually connecting the gate electrode of the high side transistor (pMOS 11) and the gate electrode of the low side transistor (nMOS 12) is shown, not limited to this example, both of the gate electrodes may be mutually insulated.

Further, each of the embodiments can be executed in a mutually combined manner.

According to the embodiments as described above, a small sized and low-cost semiconductor device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device comprising:
a first source region having p-type conductivity;
a first drain region having p-type conductivity;

a first channel region provided between the first source region and the first drain region and having n-type conductivity;
a first lower gate insulating film provided on the first channel region;
a first lower gate electrode provided on the first lower gate insulating film;
a first upper gate insulating film provided on the first lower gate electrode;
a first upper gate electrode provided on the first upper gate insulating film;
a first switching element directly connected between the first lower gate electrode and the first source region;
a second source region having n-type conductivity;
a second drain region connected to the first drain region and having n-type conductivity;
a second channel region provided between the second source region and the second drain region and having p-type conductivity;
a second lower gate insulating film provided on the second channel region;
a second lower gate electrode provided on the second lower gate insulating film;
a second upper gate insulating film provided on the second lower gate electrode;
a second upper gate electrode provided on the second upper gate insulating film; and
a second switching element directly connected between the second lower gate electrode and the second source region.

2. The device according to claim 1, wherein
the first switching element is configured to put the first lower gate electrode in a floating state when a first potential is supplied to the first channel region and a second potential lower than the first potential is supplied to the first upper gate electrode, and
the second switching element is configured to put the second lower gate electrode in a floating state when the second potential is supplied to the second channel region and the first potential is supplied to the second upper gate electrode.

3. The device according to claim 1, further comprising:
a first Zener diode having an anode connected to the first lower gate electrode and a cathode connected to the first source region; and
a second Zener diode having an anode connected to the second source region and a cathode connected to the second lower gate electrode.

4. The device according to claim 1, wherein a common gate potential is input to the first upper gate electrode and the second upper gate electrode.

5. The device according to claim 1, wherein
the thickness and the composition of the first lower gate insulating film are equal to the thickness and the composition of the second lower gate insulating film,
the thickness and the composition of the first lower gate electrode are equal to the thickness and the composition of the second lower gate electrode,
the thickness and the composition of the first upper gate insulating film are equal to the thickness and the composition of the second upper gate insulating film, and
the thickness and the composition of the first upper gate electrode are equal to the thickness and the composition of the second upper gate electrode.

6. The device according to claim 1, further comprising:
a third source region;
a third drain region;
a third channel region provided between the third source region and the third drain region;
a gate insulating film provided on the third channel region; and
a gate electrode provided on the gate insulating film,
the thickness and the composition of the gate insulating film being equal to the thickness and the composition of the first lower gate insulating film.

7. The device according to claim 1, further comprising:
a lower electrode;
a capacitive insulating film provided on the lower electrode; and
an upper electrode provided on the capacitive insulating film,
the thickness and the composition of the lower electrode being equal to the thickness and the composition of the first lower gate electrode,
the thickness and the composition of the capacitive insulating film being equal to the thickness and the composition of the first upper gate insulating film, and
the thickness and the composition of the upper electrode being equal to the thickness and the composition of the first upper gate electrode.

8. A semiconductor device comprising:
a source region having p-type conductivity;
a drain region having p-type conductivity;
a channel region provided between the source region and the drain region and having n-type conductivity;
a lower gate insulating film provided on the channel region;
a lower gate electrode provided on the lower gate insulating film;
an upper gate insulating film provided on the lower gate electrode;
an upper gate electrode provided on the upper gate insulating film; and
a switching element directly connected between the lower gate electrode and the source region.

9. The device according to claim 8, wherein the switching element is configured to put the lower gate electrode in a floating state when a first potential is supplied to the channel region and a second potential lower than the first potential is supplied to the upper gate electrode.

10. The device according to claim 8, further comprising a Zener diode having an anode connected to the lower gate electrode and a cathode connected to the source region.

11. The device according to claim 8, further comprising:
a middle gate insulating film provided between the lower gate electrode and the upper gate insulating film; and
a middle gate electrode provided between the middle gate insulating film and the upper gate insulating film.

12. The device according to claim 8, further comprising:
another source region;
another drain region;
another channel region provided between the another source region and the another drain region;
a gate insulating film provided on the another channel region; and
a gate electrode provided on the gate insulating film,
the thickness and the composition of the gate insulating film being equal to the thickness and the composition of the lower gate insulating film.

13. The device according to claim 8, further comprising:
a lower electrode;
a capacitive insulating film provided on the lower electrode; and
an upper electrode provided on the capacitive insulating film, the thickness and the composition of the lower electrode being equal to the thickness and the composition of the lower gate electrode, the thickness and the composition of the capacitive insulating film being equal to the thickness and the composition of the upper gate insulating film, and the thickness and the composition of the upper electrode being equal to the thickness and the composition of the upper gate electrode.

14. A semiconductor device comprising:
a source region having n-type conductivity;
a drain region having n-type conductivity;
a channel region provided between the source region and the drain region and having p-type conductivity;
a lower gate insulating film provided on the channel region;
a lower gate electrode provided on the lower gate insulating film;
an upper gate insulating film provided on the lower gate electrode;
an upper gate electrode provided on the upper gate insulating film; and
a switching element directly connected between the lower gate electrode and the source region.

15. The device according to claim 14, wherein the switching element is configured to put the lower gate electrode in a floating state when a second potential is supplied to the channel region and a first potential higher than the second potential is supplied to the upper gate electrode.

16. The device according to claim 14, further comprising a Zener diode having an anode connected to the source region and a cathode connected to the lower gate electrode.

17. The device according to claim 14, further comprising:
a middle gate insulating film provided between the lower gate electrode and the upper gate insulating film; and
a middle gate electrode provided between the middle gate insulating film and the upper gate insulating film.

18. The device according to claim 14, further comprising:
another source region;
another drain region;
another channel region provided between the another source region and the another drain region;
a gate insulating film provided on the another channel region; and
a gate electrode provided on the gate insulating film,
the thickness and the composition of the gate insulating film being equal to the thickness and the composition of the lower gate insulating film.

19. The device according to claim 14, further comprising:
a lower electrode;
a capacitive insulating film provided on the lower electrode; and
an upper electrode provided on the capacitive insulating film,
the thickness and the composition of the lower electrode being equal to the thickness and the composition of the lower gate electrode,
the thickness and the composition of the capacitive insulating film being equal to the thickness and the composition of the upper gate insulating film, and
the thickness and the composition of the upper electrode being equal to the thickness and the composition of the upper gate electrode.

20. The device according to claim 14, further comprising an element isolation insulator provided between the drain region and the channel region.

* * * * *